(12) United States Patent
Kurpad et al.

(10) Patent No.: US 6,982,554 B2
(45) Date of Patent: Jan. 3, 2006

(54) SYSTEM AND METHOD FOR OPERATING TRANSMIT OR TRANSMIT/RECEIVE ELEMENTS IN AN MR SYSTEM

(75) Inventors: Krishna Nagaraj Kurpad, Madison, WI (US); Steven M. Wright, College Station, TX (US); Eddy Benjamin Boskamp, Menomonee Falls, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/835,363

(22) Filed: Apr. 29, 2004

(65) Prior Publication Data

US 2005/0242816 A1   Nov. 3, 2005

(51) Int. Cl.
*G01V 3/00* (2006.01)
(52) U.S. Cl. ...................... 324/318; 324/319
(58) Field of Classification Search ............... 324/318, 324/322, 319, 309, 307, 300; 600/410

See application file for complete search history.

(56) References Cited

U.S. PATENT DOCUMENTS

| 6,313,633 | B1 | 11/2001 | Boskamp | |
|---|---|---|---|---|
| 6,400,154 | B2 * | 6/2002 | Tomanek et al. | ........... 324/318 |
| 6,404,201 | B1 | 6/2002 | Boskamp | |
| 6,411,090 | B1 | 6/2002 | Boskamp | |
| 6,429,656 | B2 * | 8/2002 | Domalski | ................... 324/318 |

* cited by examiner

*Primary Examiner*—Brij B. Shrivastav
(74) *Attorney, Agent, or Firm*—Peter J. Vogel (57) ABSTRACT

An MRI system includes an array of series resonant transmit elements 6 and 65 including individual control of RF current in all elements 106, 108, 110, 114, 116, 118, 120. The array 6 and 65 adjusts scan homogeneity during a scan or prescan phase by adjusting amplitude and phase. The array 6 and 65 also selectively excites areas of interest, thus avoiding major power dissipation and avoiding heating in the patient.

19 Claims, 4 Drawing Sheets

SYSTEM AND METHOD FOR OPERATING TRANSMIT OR TRANSMIT/RECEIVE ELEMENTS IN AN MR SYSTEM

TECHNICAL FIELD

The present invention relates generally to Magnetic Resonance Imaging (MRI) systems, and more particularly, to a system and method for operating elements in phased array coils for Magnetic Resonance Imaging.

BACKGROUND OF THE INVENTION

Magnetic Resonance Imaging (MRI) is a well-known procedure for obtaining detailed, two and three-dimensional images of patients based on nuclear magnetic resonance (NMR) principles. MRI is well suited for the imaging of soft tissues and is primarily used for diagnosing internal injuries.

Typical MRI systems include a magnet capable of producing an intense, homogenous magnetic field around a patient or portion of the patient; a radio frequency (RF) transmitter and receiver system, including a receiver coil also surrounds a portion of the patient; a magnetic gradient system localizes a portion of the patient; and a computer processing/imaging system, which receives the demodulated signals from the receiver system and processes the signals into interpretable data, such as visual images.

The superconducting magnet is used in conjunction with a magnetic gradient coil assembly, which is sequentially pulsed to create a sequence of controlled gradients in the main magnetic field during an MRI data gathering sequence. The superconducting magnet and the magnetic gradient coil assembly include the radio frequency (RF) coil on an inner circumferential side of the magnetic gradient coil assembly. The controlled sequential gradients are. effectuated throughout a patient imaging volume (patient bore) which is coupled to at least one MRI (RF) coil or antenna. The RF coils and an RF shield are typically located between the magnetic gradient coil assembly and the patient bore.

As a part of a typical MRI, RF signals of suitable frequencies are transmitted into the patient bore. Nuclear magnetic resonance (NMR) responsive RF signals are received from the patient via the RF coils. Information encoded within the frequency and phase parameters of the received RF signals, by the use of an RF circuit, is processed to form visual images. These visual images represent the distribution of NMR nuclei within a cross-section or volume of the patient, within the patient bore.

In modem MRI, the demand for high spatial and temporal resolution necessitates the use of high static magnetic field. Active electric coils are used to drive spatial gradients into the static magnetic field. Enhanced imaging sequences typically demand high amplitude gradient fields, rapid field transitions, and large duty cycles in order to improve resolution and scan time unfortunately, these properties also drive the power dissipation higher and thus cause higher temperatures in the scanner.

At high frequencies, the field generated by the volume radio frequency coils for different patient sections, e.g. head and body, becomes inhomogeneous as a result of electrical properties of patient tissue. Homogeneity becomes important during MR transmit pulses for uniform distribution of flip angles, which in turn are required for homogenous contrast or fat saturation. At these high frequencies a further problem is that a high amount of energy may be dissipated in the tissue of the patient, which is generally undesirable.

The primary design criterion for RF transmit coils for MRI is a uniform transverse RF magnetic field, which is referred to herein as $B_1$. Currently, most high frequency transmit coils are designed as periodic, symmetric structures that are resonant at the imaging frequency, as determined by the static magnetic field ($B_0$) strength. These coils are excited by one or more voltage sources.

The distribution of currents on the coil elements/axial conductors or rungs is determined by the symmetry of the coil structure. At field strengths of 3T and above, electric properties such as the dielectric constant and conductivity of the load lead to $B_1$ inhomogeneity due to wavelength effects and perturbation of the coil current distribution from the ideal.

The $B_1$ homogeneity under such conditions may be optimized by adjusting the amplitudes and phases of the currents on the rungs. However, such adjustments require independent control of current amplitudes and phases on each rung of the resonant coil. Due to strong coupling between the rungs of a resonant coil and sensitivity to loading, such independent control has not been possible and homogeneity optimization involves a time consuming and impractical iterative procedure in the absence of exact knowledge of interactions among coil elements and between the coil and load.

It would, therefore, be highly desirable to have a magnetic resonance imaging RF coil with independent control of current phase and amplitude on each conductor, which will improve control over magnetic field homogeneity. It would also be desirable only to selectively excite regions of interest rather than all regions on a patient during a scan. The present invention is directed to these ends.

SUMMARY OF THE INVENTION

One aspect of the present invention provides an MRI system including an array of series resonant transmit elements including individual control of RF current in all elements. The array adjusts scan homogeneity during a scan or prescan phase by adjusting amplitude and phase. The array also selectively excites areas of interest, thus avoiding major power dissipation and avoiding heating in the patient.

Another aspect of the present invention provides an MRI coil system including a plurality of tunable rungs arranged parallel to the axis of the main magnet, on the inner circumference of a cylindrical tube, wherein each of the plurality of tunable axial rungs includes a series resonant circuit. The system further includes a plurality of RF current sources individually coupled to respective individual members of the plurality of rungs generating currents as a function of an input control voltage, the plurality of RF current sources behaving as true voltage controlled current sources, preventing coupling between the plurality of tunable rungs. The system still further includes a controller module. The system also includes a plurality of current sources coupled to a respective member of the plurality of tunable rungs, wherein turning on a required number of current sources provides selective RF excitation in a region of interest.

One of several advantages of the present invention is superior decoupling between neighboring current elements.

Another advantage of the present invention is independent control of current amplitudes and phases on the current elements over a wide range of drive voltage amplitudes.

The present invention itself, together with attendant advantages, will be best understood by reference to the following detailed description, taken in conjunction with the accompanying figures.

BRIEF DESCRIPTION OF THE DRAWINGS

For a more complete understanding of this invention reference should now be had to the embodiments illustrated in greater detail in the accompanying figures and described below by way of examples of the invention wherein.

DETAILED DESCRIPTION OF THE PREFERRED EMBODIMENT

In each of the following figures, the same reference numerals are used to refer to the same components. The present invention is described with respect to an MRI control method and apparatus for high field MR scanners including: MRI systems, magnetic resonance spectroscopy systems, and other applications where scan homogeneity is desirable.

In the following description, various operating parameters and components are described for one constructed embodiment. These specific parameters and components are included as examples and are not meant to be limiting.

Figure 1:
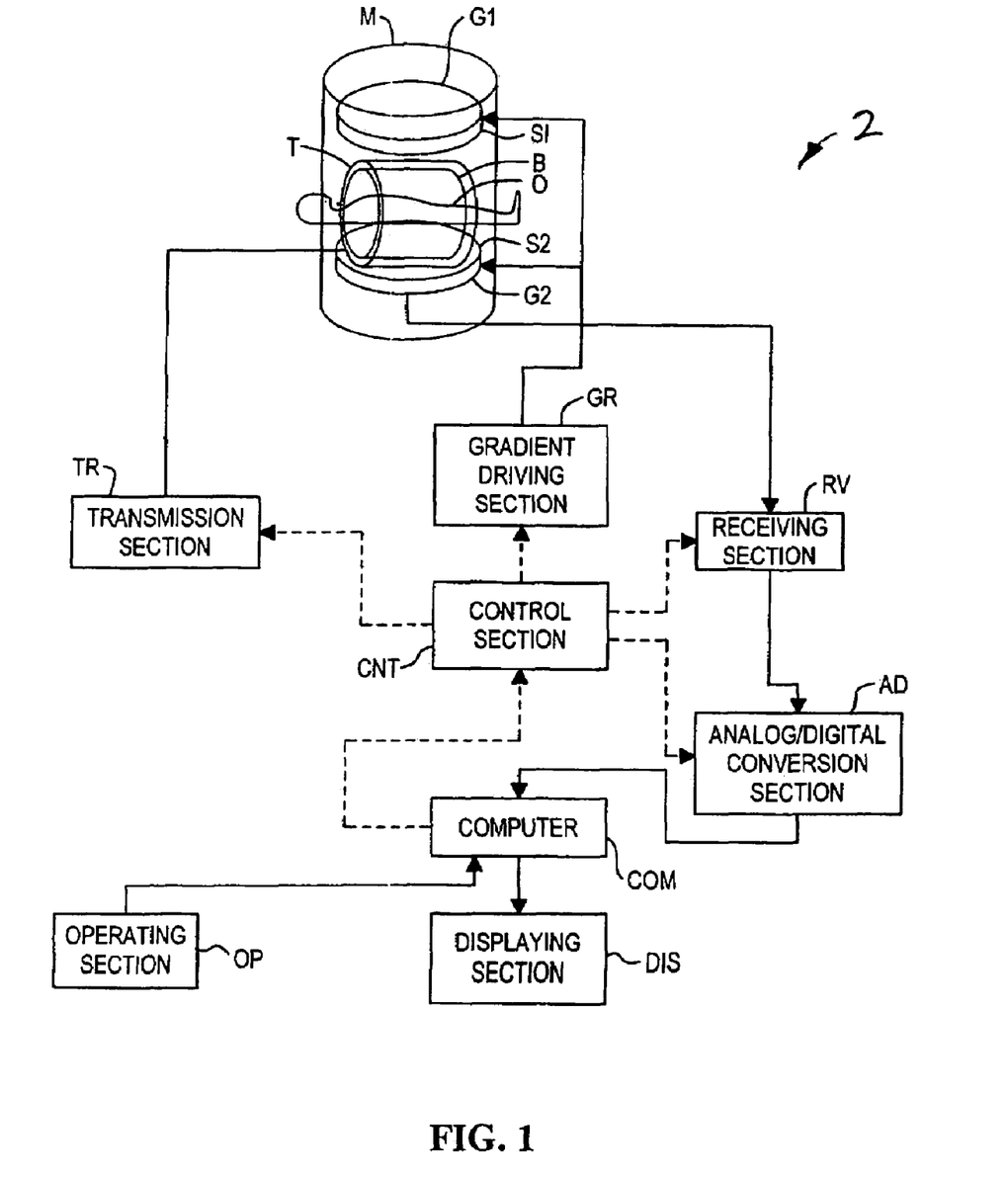
FIG. 1 is a block diagrammatic view of an MRI control system in accordance with an embodiment of the present invention.

Referring now to FIG. 1, there is shown a block diagram of an MRI system 2 operable to perform a magnetic resonance imaging by using a radio frequency coil according to the present invention.

The system of FIG. 1 is operated such that a static magnetic field generating section M may form a uniform static magnetic field in its inner space. The static magnetic field generating section M is comprised of a pair of magnetic generators formed by permanent or superconductive magnets (not shown), for example, these magnetic generators are spaced apart in a horizontal direction and oppositely faced to each other so as to form a static magnetic field (a horizontal magnetic field) in the opposing space. Each of the gradient coil sections G is arranged at the front surface of the magnetic generator and they are similarly spaced apart and opposed in a horizontal direction from each other.

A transmission coil section T forming a cylindrical assembly is installed within the static magnetic field space between the gradient coil sections G. A body coil section B forming a cylindrical assembly is installed within the static magnetic field space within the transmission coil T. A central axis of the body coil section B is crossed at a right angle with a direction of the static magnetic field. Between the gradient coil sections G and the transmission coil T there is an RF shield S that shields the transmission coils from the gradient coils. Although separate RF coils are shown for excitation (transmission coil T) and detection (body coil B), the same coil or array of coils may be used for both purposes.

An inspected body O is inserted into the inner space of the body coil section B. A body axis of the inspected body O is aligned with a direction of the static magnetic field.

The transmission coil section TR is connected to the transmission coil T. The transmission coil section TR applies a driving signal to the transmission coil T so as to generate a radio (RF) magnetic field, thereby a spin in the body of the inspected body O is excited. The transmission coil T and transmission coil section TR is one example of an embodiment of the transmission coil of the present invention. Details of the transmission coil will be described below with reference to FIG. 2. A gradient driving section GR is connected to the gradient coil sections G. The gradient driving section GR applies a driving signal to the gradient coil sections G so as to generate a gradient magnetic field. To the body coil section B is connected a receiving section RV. To the receiving section RV is inputted a magnetic resonance receiving signal received by the body coil section B.

To the receiving section RV is connected an analog-to-digital conversion section AD. The analog-to-digital conversion section AD operates to convert an output signal of the receiving section RV into a digital signal. The analog-to-digital conversion section AD is connected to a computer COM. To the computer COM is inputted a digital signal from the analog-to-digital conversion section AD, wherein an image reforming process is carried out in response to the input digital signal, and an image of the inspected body O is generated.

To the computer COM a displaying section DIS and an operating section OP are connected. The displaying section DIS displays an image generated by the computer COM. The displaying section DIS also displays various kinds of information outputted from the computer COM. The operating section OP is operated by an operator so as to input various kinds of instructions or information to the computer COM.

To the computer COM is also connected a control section CNT. The control section CNT is connected to the transmission section TR, the gradient driving section GR, the receiving section RV, the analog-to-digital conversion section AD and the imaging table on which the inspected body O rests. The control section CNT receives instructions from the computer COM and outputs control signals to each of the transmission section TR, the gradient driving section GR, the receiving section RV, the analog-to-digital conversion section AD and the imaging table so as to perform an imaging operation.

Figure 2:
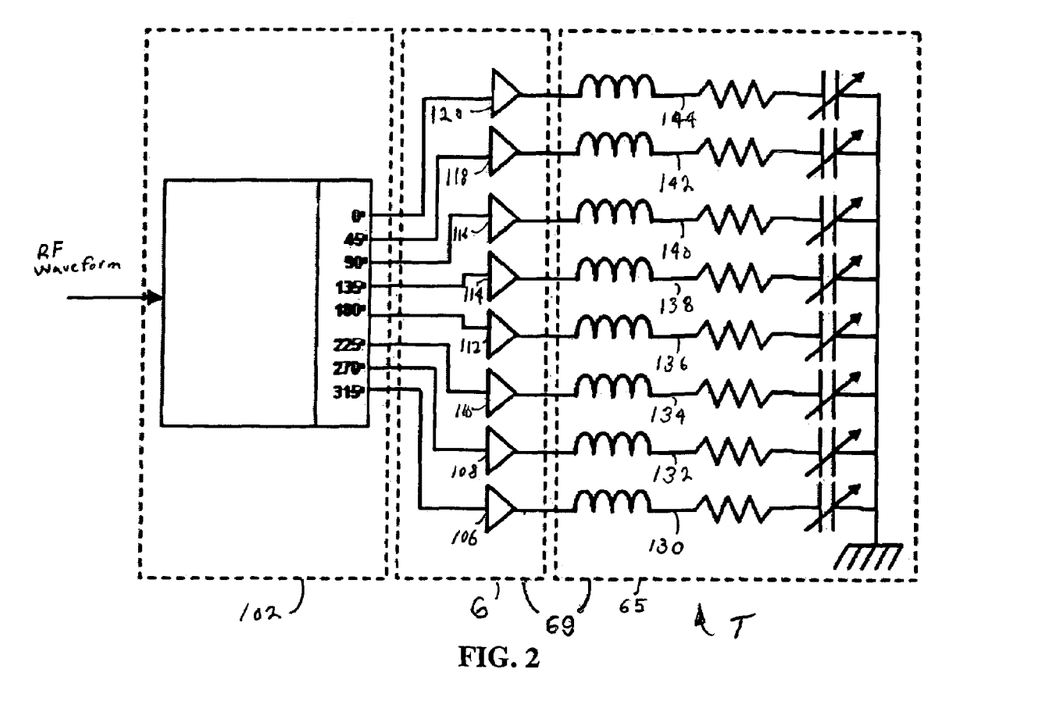
FIG. 2 is a circuit schematic of the transmit coil system of FIG. 1.

Referring now to FIG. 2 there is shown a schematic block diagram of one embodiment of the transmit coil T according to the present invention for use in the exemplary system 2 of FIG. 1.

The system 2 includes an array of transmit elements 6 and 65 (transmit array) within the transmit coil T, all of which are coupled to the MRI M and are discussed thoroughly herein.

The transmit coil T includes the transmit array 6, which is coupled to a plurality of rungs 65. Each of the rungs 65 receives RF signals from a controller 102 through an associated amplifier, such as a MOSFET. These signals control each rung 65 individually, as will be discussed later.

RF array elements 6 and 65 are components of the RF front end of a phased array antenna 69. The RF array elements 6 and 65 feed power into the array elements 65 through matching networks. The matching networks ensure maximum power transfer between the RF array elements 6 and 65 and the phased array transmitter 64. Since the matching networks are designed for specific impedance transformation ratios, the RF array elements 6 and 65 can be modeled as voltage sources connected across the array elements 65.

The current on the array element 65 (rung) is then determined by the impedance presented to the matching network in addition to the applied voltage from a control module. This is known as a free excitation scheme. In the presence of other array elements 65 in the vicinity, the impedance presented to the matching network is a function of the current amplitude and phase on each of those elements. This is because of the electromagnetic phenomenon of mutual impedance. Therefore, in order to exercise accurate control over the amplitudes and phases of currents on each array element 65, it is important to have an accurate knowledge of the mutual impedances.

In the context of MRI, the interest is in generation of a uniform, near magnetic field, the $B_1$ field. This is generated by currents on the antenna elements 69. It would therefore be desirable to accurately control the current amplitude and phase on the rungs 65 of the transmit coil T. The transmit coils T are designed as resonant structures that are excited by an RF amplifier which can be modeled as a voltage source.

Optimal field homogeneity is achieved through multi-port excitation of the RF coil T with independent control of excitation amplitude and phase. However, with the currently used free excitation scheme, the mutual impedances between the strongly coupled loops of the transmit coil T should be accurately determined in the presence of the load (in order to accurately set up the currents required to create the desired $B_1$ field).

This has been a very tedious process and very sensitive to load position and composition. One embodiment of the present invention for solving this problem includes implementing multi-port excitation to use forced current excitation such that each array element is driven by an RF current source 6 at the Larmour frequency.

The present invention includes such a forced excitation scheme as was discussed. A voltage controlled RF current source 6 integrated with an array element or rung 65 is implemented utilizing the concepts of MOSFET 80 based power amplifier design and active integrated antenna 69. The MOSFET 80 behaves as a true voltage controlled RF current source 6. The present invention includes independent control of the rung current amplitude and phase by varying the control voltage amplitude and phase is demonstrated.

The transmit coil system T includes the controller module 102 and eight current elements (RF current sources 6 including a first source 106, a second source 108, a third source 110, a fourth source 112, a fifth source 114, a sixth source 116, a seventh source 118, and an eighth source 120) arranged on a cylindrical former to form a transmit phased array volume coil T.

Figure 3:
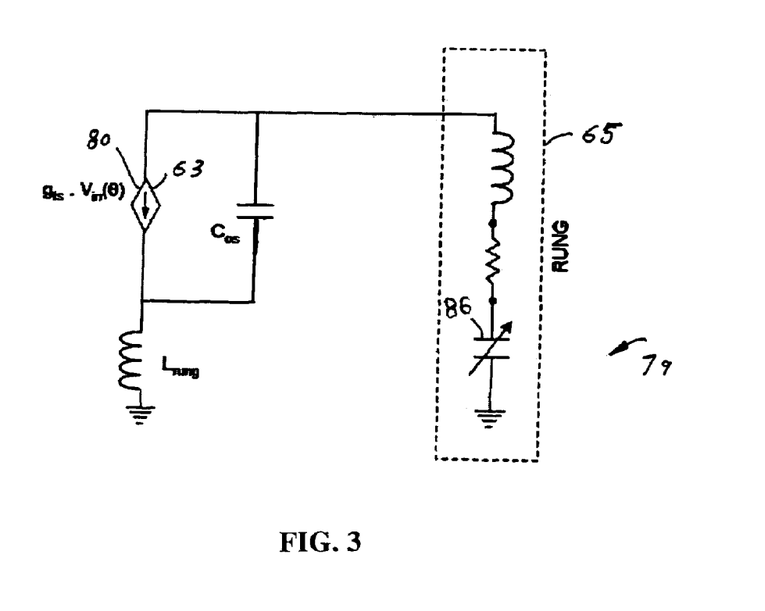
FIG. 3 is a circuit schematic of a MOSFET voltage controlled RF current source in accordance with another embodiment of the present invention.

The $B_1$ field generator of each channel is a current element which includes a rung 65 integrated with a MOSFET voltage controlled current source, as illustrated in FIG. 3. The control voltage is supplied by the controller module 102. One embodiment of the present invention includes a cylindrical acrylic former as the base structural material for the transmit array coil design. Eight rectangular acrylic strips are glued to the inner surface of the former at equal radial angles of 45° with respect to each other. Strips of, for example, copper tape are affixed to the long face of the rectangular strips, facing into the cylindrical cavity, such that they are centered on the strips.

The aforementioned are the rungs 65 of the RF transmit coil T. Each of the rungs 65 (i.e. first 130, second 132, third 134, fourth 136, fifth 138, sixth 140, seventh 142, eight 144) are coupled to respective current elements for receiving signals from the controller 102 therethrough. The rungs 65 are tunable, in addition to being able to receive control signals. The controller 102 receives signals from an RF waveform, as will be understood by one skilled in the art.

Current elements 6 and 65 are versatile magnetic field generators and can be used in several configurations, custom made for specific applications. The present invention optimizes $B_1$ fields in the presence of asymmetrically placed loosely dielectric loads for high field MRI. Two other embodiments using current elements, not necessarily at high fields, are described below The current elements 6 and 65 could be placed in specific arrangements and the current phase and amplitudes could be set to obtain any desired excitation pattern. A simple example is a rectangular loop in which only the z-directional currents generate useful fields. Conductors in the transverse direction only serve to complete the circuit. The size of each loop has to be varied for different applications. On the other hand, a pair of current elements, placed parallel to each other along the z direction, with current phase relation of 180°, would achieve the same result. The distance between the current elements 6 and 65 could be adjusted to simulate any size of rectangular loop.

Multi-dimensional spatially, selective excitation is used in a number of applications such as fast imaging with field-of-view restriction, selective flow tagging, three dimensionally localized spectroscopy and curved slice imaging, among others. Spatially selective excitation is implemented using specialized magnetic field gradient pulses. In such applications, the volume transmit array 6 would be useful in providing selective RF excitation in the region of interest by turning ON the required number of current elements 6 and 65, thus reducing the RF power requirement. This is possible because the current elements 6 and 65 are well decoupled from each other as described in the rungs 65. Each rung 65 is divided into five segments which are connected to each other through chip capacitors. At the other end, the rungs 65 are connected to a copper strip cut out on the RF shield by passing copper tapes through the rectangular holes at the other end of the former. The copper strips on the shield are then connected to the RF shield through trimmer capacitors as illustrated in FIG. 3.

The present invention is an array of transmit elements 6 with individual control of RF current in all elements 106, 108, 110, 114, 116, 118, 120. The array 6 adjusts scan homogeneity during a prescan phase by adjusting amplitude and phase. The array 6 also selectively excites areas of interest, thus avoiding major power dissipation and avoiding heating in the patient. The present invention includes coil integrated power amplifier elements 106, 108, 110, 114, 116, 118, 120 whereby a series resonant circuit 65 is used to prevent coupling between the elements 106, 108, 110, 114, 116, 118, 120.

Figure 4:
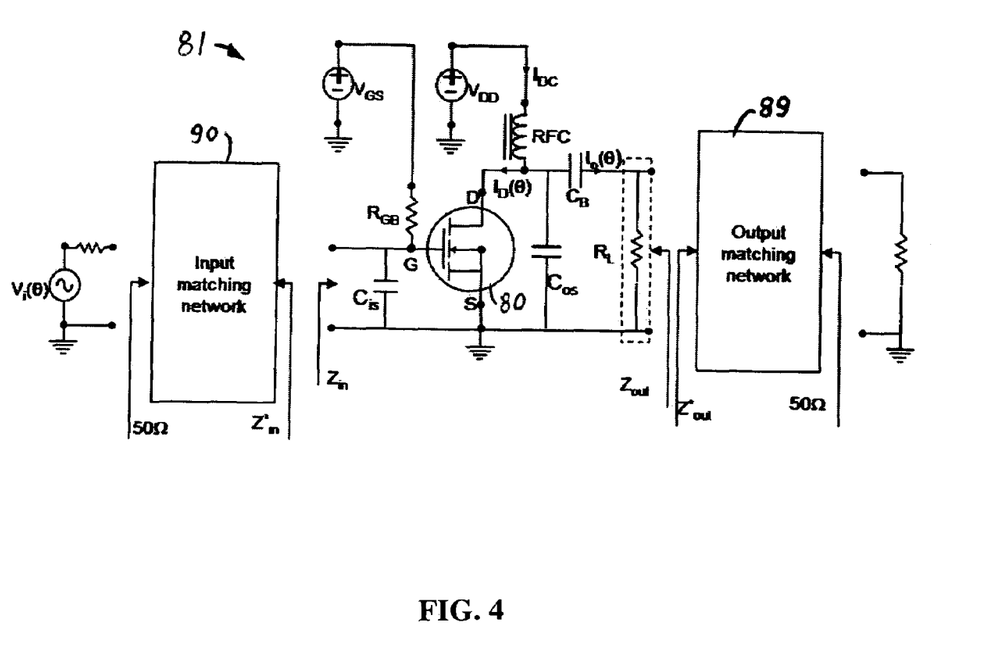
FIG. 4 is a circuit schematic of a conventional MOSFET power amplifier.

Referring to FIG. 4, a circuit schematic 81 of a conventional MOSFET power amplifier is illustrated. For design of a conventional MOSFET power amplifier, the drain voltage supply is used to set the MOSFET 80 in the saturation region. The gate voltage sets the operating point of the MOSFET 80. The output and input matching networks 89, 90 provide conjugate match for maximum power transfer.

$C_B$ is the DC blocking capacitor, which acts as a short for RF. The steps involved in the design of the above power amplifier are summarized as follows: the MOSFET 80 is placed in the saturation region of its characteristic by providing an appropriate DC supply voltage at the drain terminal via the RF choke (RFC).

Therefore, a key feature of the MOSFET 80 RF amplifier is that the MOSFET 80 is used to drive current through a high resistance load. This creates a voltage drop across the load. $R_L$ is a virtual load presented to the MOSFET 80 by the output matching network.

The MOSFET 80 therefore drives current through the components of the output matching network. Therefore, amplified power is transferred to standard load or next amplification stage through the output matching network.

As was mentioned, FIG. 3 illustrates the circuit schematic 79 of the MOSFET 80 RF voltage controlled RF current source 6. The RF current source design is a modified version of the classical RF power amplifier, where the virtual load resistance, $R_L$ has been replaced by the array element 65 (rung), represented by a series LCR network. The MOSFET 80 is illustrated as a voltage controlled current source 6, integrated with the rung. The lumped element inductor and resistor represent the distributed inductance and series resistance of the rung. The variable capacitor is used to tune the rung 65 to series resonance. Such a tuning of the rung 65 is henceforth referred to as "Series tuning". A series tuned rung 65 integrated with the current source 6 is henceforth referred to as a "Current element".

In the present invention, the MOSFET 80 drives RF current through the low resistance rung 65. In the absence of an output matching network, there is no mechanism to compensate for the parasitic output capacitance, $C_{os}$. Hence, $C_{os}$ appears as a shunt reactance across the rung 65 and serves to divert current from the rung 65 as the magnitude of rung 65 impedance approaches $X_{Cos}$.

This makes it necessary for the rung 65 impedance to be as small as possible, compared to $X_{Cos}$. One embodiment includes the RF current source 6 having the rung current amplitude and phase vary linearly as the input voltage amplitude and phase respectively.

This enables predictable and simple control of rung currents over the entire range of the current handling capacity of the MOSFET 80. Another embodiment includes the control of current amplitude and phase independent of each other. This ensures linearity in response of the RF current source 6 to the input voltage stimulus.

The MOSFET 80 is represented by a voltage controlled current source 6. $C_{os}$ includes the output capacitance, and the total capacitance in the feedback path. $L_{lead}$ represents the package lead inductance. The rung 65 is represented by a series LRC network. The variable capacitor is used to set the impedance of the rung.

The output circuit of the MOSFET 80 includes of the array element or rung. One end of the rung 65 is connected to the drain terminal of the MOSFET 80 through the rectangular opening, R. The rung 65 is broken up into five segments by four chip capacitors. This increases the uniformity of current amplitude along the z direction and also to push the self resonance frequency of the rung 65 higher. The other end of the rung 65 is connected to the RF shield by a trimmer capacitor. The range of the trimmer is chosen such that the rung 65 impedance, as measured from the drain terminal of the MOSFET 80, varies from capacitive to inductive through a series resonance point.

Integration of the current source 6 with the rung 65 includes the PCB close to the RF shield 58 as possible for two reasons. One is to minimize the length of the rung 65 that is not utilized in the creation of $B_1$ field. The other reason is to maintain low coil profile when it is placed on the patient table for patient comfort.

The rung 65 forms a resonant loop 79 with $C_{os}$, according to the output circuit model illustrated in FIG. 3. This loop is henceforth referred to as the output circuit loop 79. The resonance frequency of the output circuit loop 79 is a function of the value of the trimmer capacitor 86.

When the rung 65 is tuned to series resonance, it provides an alternative low resistance path to ground for RF current and is in parallel with $C_{os}$. For this condition, the RF current sourced from the MOSFET 80 flows entirely through the rung 65. The amplitude of the rung current is linearly related to the amplitude of the gate voltage.

The phase difference between the rung current and the input voltage is constant at 47° both with variation in amplitude of the rung current and with variation of phase of the RF gate voltage. Thus the MOSFET 80 behaves as a true voltage controlled RF current source 6 (linear current source) for the rung 65 when the rung 65 is tuned to series resonance. The series resonant rung 65, integrated with the MOSFET 80 can therefore be termed as a "current element". The amplitude and phase of the magnetic field generated by the current element is linearly dependent on the RF gate voltage.

When the rung 65 is tuned to series resonance, the MOSFET 80 behaves as a linear current source 6. The range of rung 65 impedances for which the MOSFET 80 behaves as a true current source is limited by the output parasitic capacitance of the MOSFET 80. The amplitude and phase of the current are linearly dependent on the amplitude and phase, respectively, of the input control voltage. The resonance of the loop formed by the rung 65 and the output capacitance is at a higher frequency than the Larmour frequency.

The MOSFET 80 transitions from a current source 6 to a voltage source as the rung 65 is tuned to parallel resonance with the output capacitance of the MOSFET 80. The loop current is higher than in the case of current source operation. However, current source mode may be the preferred mode of operation due to reduced coupling.

It is also illustrated that when the rung 65 is tuned such that it forms a parallel resonant loop with parasitic capacitance ($C_{os}$), the MOSFET 80 behaves as a voltage source for the resonant loop. Such a rung 65 tuning is henceforth referred to as "Parallel tuning". A parallel tuned rung 65 is henceforth referred to as a "Voltage controlled element" or "Voltage element" for short.

The embodied current elements 6 and 65 provide superior range of current amplitude and phase control as compared to voltage elements. The current elements are placed in a volume coil configuration such that the structure as a whole is non-resonant at the Larmour frequency. A non-resonant structure may include a structure in which the coil elements are weakly coupled to each other. The non-resonant volume coil is then used to demonstrate the capability of controlled pattern formation in the imaging volume by suitably adjusting the amplitudes and phases of the currents on the current elements. The well known modal patterns of a birdcage coil are replicated in a controlled manner by setting up the appropriate currents on the current elements 6 and 65.

Figure 6:
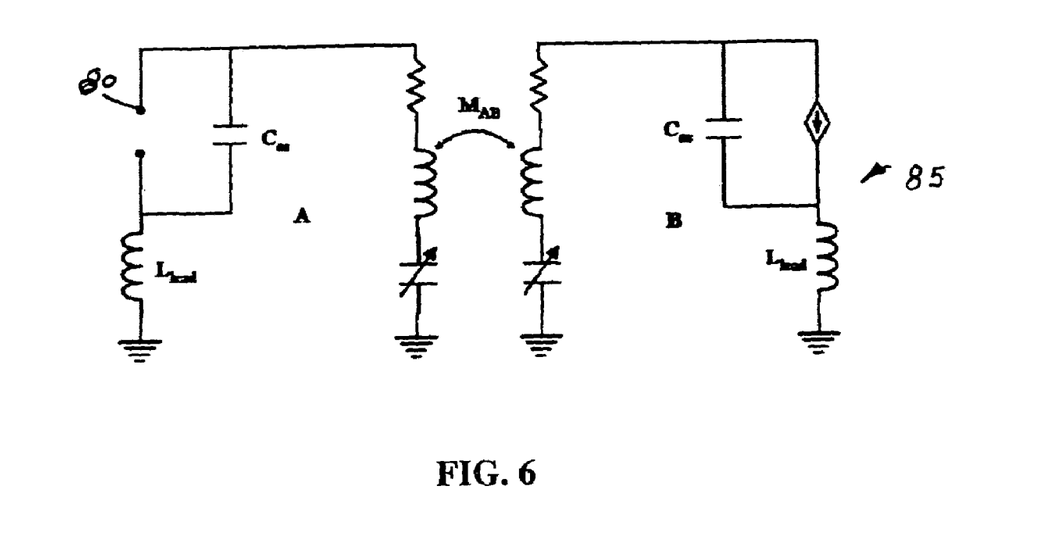
FIG. 6 is a circuit schematic of current element A from FIG. 5.

FIG. 6 is a schematic 85 of two current elements, A and B, in close proximity to each other. It follows from Faraday's law of electromagnetic induction that any current on A induces an electro-magnetic field (emf) in B and vice-versa.

A is the test element and is tuned first as a current element and then as a voltage element. B is tuned as a current element. $M_{AB}$ denotes the coupling between the two elements.

FIG. 6 further illustrates the induced emf due to current element B as a voltage source in series with the rung. The MOSFET 80, placed in saturation but biased OFF, is represented as an open circuit.

A is the test element with its MOSFET 80 placed in its saturation region and biased OFF, but not driven, i.e. $V_{GS}<V_T$, $V_{DS}=V_{DD}$ where $V_{GS}$ is the DC voltage applied to a gate of the MOSFET, $V_T$ is a threshold voltage at which the MOSFET begins to conduct, $V_{DS}$ is the voltage drop across the drain and source terminals, and $V_{DD}$ is the DC supply voltage applied to the drain of the MOSFET. The MOSFET 80 can then be represented as an open circuit due to the high internal resistance in. its saturation region.

B is the current element with RF current of amplitude ($I_o$) flowing through it. $E_{ind}$ is the induced emf in A due to the current in B. Element A can now be represented by the circuit schematic 87 of FIG. 5, where $E_{ind}$ is represented by a voltage source placed in series with the rung 65 and the current source 6 is replaced by an open circuit 83.

Figure 5:
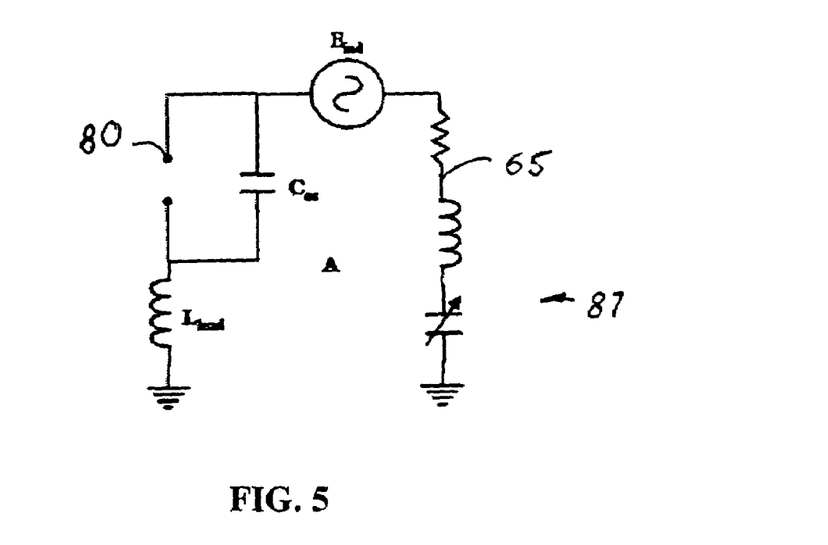
FIG. 5 is a circuit schematic of two current elements, A and B, in close proximity to each other.

The complex impedance ($Z_s$) of the loop formed by the series tuned loop and $C_{os}$ is defined as:

$$Z_s = R_{rung} - jXC_{os}$$

where $R_{rung}$ is the series resistance of the rung 65. The rung 65 impedance is a pure resistance because of the series tuning of the rung 65. The amplitude of the induced current ($I_s$) in the loop is given defined as:

$$|I_s| = \frac{E_{ind}}{Z_s}$$

where $|Z_s| = \sqrt{R_{rung}^2 + X_{C_{os}}^2}$

The tuning of the rung 65 is changed such that it forms a resonant loop with $C_{os}$. The loop impedance, $Z_p$, is then a real quantity and is equal to $R_{rung}$. The emf induced in A due to B is governed by Faraday's law of electromagnetic induction and remains unchanged for a given current on B, irrespective of the tuning of A. The amplitude of the induced current ($I_p$) in the resonant loop is therefore given by $$|I_p| = \frac{E_{ind}}{R_{rung}}$$

The ratio ($I_{ratio}$) of the induced currents in the two cases is then $$I_{ratio} = \frac{|I_s|}{|I_p|} = \frac{R_{rung}}{|Z_s|}$$

From Ohm's law, the amplitude of current induced in a current element is dependent on the magnitude of impedance presented to the induced emf. The impedance magnitude is, in turn, governed by the magnitude of $C_{os}$ since $R_{rung}$ is constant and is relatively small compared to $X_{C_{os}}$. Therefore, from the above equations, it is evident that the current induced in a current element is less than that induced in a voltage element.

Rung current amplitudes and phases for high pass birdcage modes are determined in the following. N is the number of rungs 65 in the birdcage coil. j is the index number of the rung 65 such that j=0,1,2, . . . N−1 and m is the mode number. Then the modal rung currents for a linearly excited high pass birdcage coil are given by the following:

$$(I_j)_m = \begin{cases} \cos\frac{2\pi mj}{N} & m = 0, 1, 2, \ldots, \frac{N}{2} \\ \sin\frac{2\pi mj}{N} & m = 0, 1, 2, \ldots, \frac{N}{2}-1 \end{cases}$$

For a high pass birdcage coil, mode 0 is the endring mode. Modes 1 through (N−1), where N is the number of rungs, are degenerate modes, which occur at the same frequency but are opposite in sense. Therefore, in order to calculate the rung currents required to create the birdcage modal patterns, it is sufficient to consider the cosine term.

If the rung currents of another linearly excited birdcage coil are rotated geometrically through 90°, phase shifted through 90°, then the rung current distribution of a quadrature birdcage coil is obtained.

The rung current amplitudes are uniformly distributed over all the rungs 65 for some mode numbers, for example, m=1,5. The rung current amplitudes are not uniformly distributed for others, for example, m=3,7 because the two excitation points are not orthogonal to each other for these modes. The rung currents generate respectively, linearly and circularly polarized $B_1$ fields in the imaging volume.

In operation, a waveform generator and power amplifier communicate RF waveforms to the rungs 65 to generate the RF magnetic field. For reception, mechanical leads are connected to the RF coil T to communicate and receive signals to a data acquisition system, as is known in the art. Outputs of the data acquisition system are then multiplexed and combined by a microprocessor according to a processing algorithm to produce and display an overall image signal.

The above-described system and method, to one skilled in the art, is capable of being adapted for various purposes and is not limited to the following systems: MRI systems, magnetic resonance spectroscopy systems, and other applications where high bore temperature is an issue in the design of system components. The above-described invention may also be varied without deviating from the spirit and scope of the invention as contemplated by the following claims.

What is claimed is:

1. A radio frequency (RF) coil for resonance imaging/analysis comprising:
    a plurality of tunable axial rungs arranged in parallel to define an imaging volume;
    a plurality of RF current sources individually coupled to respective individual members of said plurality of axial rungs generating currents as a function of an input control voltage, wherein said RF current sources are arranged such that an excitation pattern of the RF coil is adjustable such that a distance between said RF current sources is adjusted to simulate any size of rectangular loop; and
    a controller generating said input control voltage for varying amplitude and phase of said current sources.

2. The system of claim 1, wherein each of said plurality of tunable axial rungs comprises a series resonant circuit preventing coupling between said plurality of RF current sources.

3. The system of claim 1, wherein said plurality of RF current sources comprise a plurality of MOSFETs.

4. The system of claim 1, wherein said plurality of RF current sources behave as true voltage controlled current sources for said plurality of tunable axial rungs when said plurality of tunable axial rungs are tuned to a series resonance.

5. The system of claim 1, wherein a resonance of loops formed by each of said plurality of tunable axial rungs and an output capacitance for each of said plurality of tunable axial rungs is set at a higher frequency than Larmour frequency.

6. The system of claim 1, wherein said plurality of RF current sources transition from current sources to voltage sources as each rung is tuned to a parallel resonance with an output capacitance of a respective member of said plurality of RF current sources.

7. The system of claim 1, wherein turning on a required number of current elements through signals from said controller provides selective RF excitation in a region of interest.

8. The system of claim 1, wherein the RF coil adjusts homogeneity during a scan or prescan by adjusting said amplitude and said phase.

9. The system of claim 1, wherein said controller comprises a power splitter splitting power between said rungs, a variable phase shifter for adjusting said phase, a variable attenuator for varying said amplitude.

10. A transmit coil system comprising:
a first current element; and a second current element arranged with said first current element on a cylindrical former thereby defining a transmit phased array volume coil, said transmit phased array volume coil comprising:
a first rung coupled to said first current element, said first rung comprising a first series resonant circuit,
a first adjustable capacitor adjusting an electrical response of said first rung, said second rung, in a parallel circuit arrangement with said first rung, coupled to said second current element, said second rung comprising a second series resonant circuit preventing coupling between said first rung and a second rung;
a second adjustable capacitor within the transmit coil system adjusting an electrical response of said second rung.

11. The system of claim 10 further comprising a controller generating an input control voltage for varying amplitude and phase of said first current element and said second current element.

12. The system of claim 10, wherein said controller comprises a power splitter splitting power between said first rung and said second rung, a variable phase shifter for adjusting said phase, a variable attenuator for varying said amplitude.

13. The system of claim 10 further comprising a plurality of adjustable rungs arranged in parallel, wherein a plurality of respective adjustable capacitors are coupled thereto such that each of said plurality of rungs is individually controlled.

14. The system of claim 10 further comprising a controller coupled to said first current element and said second current element, said controller comprising a power splitter splitting power between said rungs, a variable phase shifter for adjusting said phase, a variable attenuator for varying said amplitude.

15. The system of claim 10, wherein said first current element and said second current element behave as true voltage controlled current sources for said first rung and said second rung when said first rung and said second rung are tuned to a series resonance.

16. The system of claim 10, wherein a resonance of loops formed by each of said first rung and said second rung and an output capacitance for each of said first rung and said second rung is set at a higher frequency than Larmour frequency.

17. The system of claim 10, wherein said first current element and said second current element transition from current sources to voltage sources as each rung is tuned to a parallel resonance with an output capacitance of a respective member of said first current element and said second current element.

18. The system of claim 10, wherein turning on a required number of current elements including said first current element or said second current element through signals from a controller provides selective RF excitation in a region of interest.

19. An MRI coil system comprising:
a plurality of tunable axial rungs arranged in parallel to define an imaging volume, wherein each of said plurality of tunable axial rungs comprises a series resonant circuit preventing coupling between a plurality of RF current sources, wherein a resonance of loops formed by each of said plurality of tunable axial rungs and an output capacitance for each of said plurality of tunable axial rungs is set at a higher frequency than Larmour frequency;
said plurality of RF current sources individually coupled to respective individual members of said plurality of axial rungs generating currents as a function of an input control voltage, said plurality of RF current sources behaving as true voltage controlled current sources;
a power splitter distributing an RF signal across each of said plurality of tunable axial rungs;
a plurality of current sources, each of said plurality of current sources coupled to a respective member of said plurality of tunable axial rungs, wherein turning on a required number of current sources provides selective RF excitation in a region of interest.

* * * * *